(12) United States Patent
Sooriyakumaran et al.

(10) Patent No.: US 7,550,254 B2
(45) Date of Patent: *Jun. 23, 2009

(54) FLUORINATED SILSESQUIOXANE POLYMERS AND USE THEREOF IN LITHOGRAPHIC PHOTORESIST COMPOSITIONS

(75) Inventors: Ratnam Sooriyakumaran, San Jose, CA (US); Robert David Allen, San Jose, CA (US); Debra Fenzel-Alexander, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/789,902

(22) Filed: Apr. 25, 2007

(65) Prior Publication Data

US 2007/0202440 A1  Aug. 30, 2007

Related U.S. Application Data

(60) Division of application No. 10/079,289, filed on Feb. 19, 2002, now Pat. No. 7,261,992, which is a continuation-in-part of application No. 09/748,071, filed on Dec. 21, 2000, now abandoned.

(51) Int. Cl.
*G03F 7/30* (2006.01)
*G03F 7/075* (2006.01)
(52) U.S. Cl. .................. 430/325; 430/326; 430/270.1; 430/271.1
(58) Field of Classification Search ........................ None
See application file for complete search history.

(56) References Cited

U.S. PATENT DOCUMENTS

| 4,189,323 A | 2/1980 | Buhr |
| 4,442,197 A | 4/1984 | Crivello et al. |
| 4,491,628 A | 1/1985 | Ito et al. |
| 4,603,101 A | 7/1986 | Crivello |

(Continued)

FOREIGN PATENT DOCUMENTS

| CA | 1204547 | 5/1986 |
| JP | 1-293339 | 11/1989 |

OTHER PUBLICATIONS

Abe et al. (1995), "Study of ArF Resist Material in Terms of Transparency and Dry Etch Resistance," *Journal of Photopolymer Science and Technology* . 8(4):637-642.

(Continued)

*Primary Examiner*—Cynthia Hamilton
(74) *Attorney, Agent, or Firm*—Isaac M. Rutenberg; Mintz Levin Cohn Ferris Glovsky and Popeo PC

(57) ABSTRACT

Fluorocarbinol- and/or fluoroacid-functionalized silsesquioxane polymers and copolymers are provided. The polymers are substantially transparent to ultraviolet radiation (UV), i.e., radiation of a wavelength less than 365 nm and are also substantially transparent to deep ultraviolet radiation (DUV), i.e., radiation of a wavelength less than 250 nm, including 157 nm, 193 nm and 248 nm radiation, and are thus useful in single and bilayer, positive and negative, lithographic photoresist compositions, providing improved sensitivity and resolution. A process for using the composition to generate resist images on a substrate is also provided, i.e., in the manufacture of integrated circuits or the like.

10 Claims, 1 Drawing Sheet

U.S. PATENT DOCUMENTS

| | | | |
|---|---|---|---|
| 4,624,912 | A | 11/1986 | Zweifel et al. |
| 4,855,017 | A | 8/1989 | Douglas |
| 5,338,818 | A | 8/1994 | Brunsvold et al. |
| 5,344,742 | A | 9/1994 | Sinta et al. |
| 5,362,663 | A | 11/1994 | Bronner et al. |
| 5,385,804 | A | 1/1995 | Premlatha et al. |
| 5,399,462 | A | 3/1995 | Sachdev et al. |
| 5,429,710 | A | 7/1995 | Akiba et al. |
| 5,562,801 | A | 10/1996 | Nulty |
| 5,580,694 | A | 12/1996 | Allen et al. |
| 5,618,751 | A | 4/1997 | Golden et al. |
| 5,679,495 | A | 10/1997 | Yamachika et al. |
| 5,744,376 | A | 4/1998 | Chan et al. |
| 5,801,094 | A | 9/1998 | Yew et al. |
| 5,985,524 | A | 11/1999 | Allen et al. |
| 6,087,064 | A | 7/2000 | Lin et al. |
| 6,531,260 | B2 | 3/2003 | Iwasawa et al. |
| 6,623,909 | B2 | 9/2003 | Hatakeyama et al. |
| 2001/0041769 | A1* | 11/2001 | Iwasawa et al. ............. 524/588 |
| 2002/0012871 | A1* | 1/2002 | Hatakeyama et al. .... 430/270.1 |
| 2002/0081520 | A1* | 6/2002 | Sooriyakumaran et al. ........................ 430/270.1 |
| 2002/0090572 | A1* | 7/2002 | Sooriyakumaran et al. ........................ 430/271.1 |
| 2004/0137241 | A1* | 7/2004 | Lin et al. .................... 428/447 |
| 2004/0265754 | A1* | 12/2004 | Barclay et al. .............. 430/322 |
| 2005/0089792 | A1* | 4/2005 | Huang et al. ............. 430/270.1 |

OTHER PUBLICATIONS

Allen et al. (1995), "Resolution and Etch Resistance of a Family of 193 nm Positive Resists," *Journal of Photopolymer Science and Technology* 8(4):623-636.

Allen et al. (1997), "Deep-UV Resist Technology: The Evolution of Materials and Processes for 250-nm Lithography and Beyond," *Handbook of Microlithography, Micromachining, and Microfabrication, vol. 1: Microlithography*, P. Raj-Coudhury, Ed., p. 321-375.

Baney et al. (1995), "Silsesquioxanes," *Chemical Reviews* 95(5):2409-1430.

U.S. Appl. No. 09/514, 212, filed Feb. 28, 2000, Brock et al.

Crawford et al. (2000), "New Materials for 157 nm Photoresists: Characterization and Properties," *Proceedings of SPIE* 3999:357-364.

Fujigaya et al. (2000), "Chemically Amplified Positive Resist Based on Silsequioxane for 157 nm, Lithography," *Extended Abstracts, 12th International Conference on Photopolymers—Principles, Processes, and Materials*, The Legends Resort and Country Club, McAfee, New Jersey, p. P39.

Hatakeyama et al. (1998), "Investigation of Discrimination Enhancement in Polysilsesquioxane Based Positive Resist for ArF Lithography," *Advances in Resist Technology and Processing XV, Proceedings of SPIE* 3333:62-72.

Ito et al. (1982), "Polymerization of Methyl α-(Trifluoromethyl)acrylate and α-(Trifluoromethyl)acrylonitrile and Copolymerization of These Monomers with Methyl Methacrylate," *Macromolecules* 15:915-920.

Ito et al. (1987), "Anionic Polymerization of α-(Trifluoromethyl)Acrylate," *Recent Advances in Anionic Polymerization*, T.E. Hogen-Esch and J. Smid, Eds., Elsevier Science Publishing Co., Inc., pp. 421-430.

Ito et al. (1997), "Synthesis and Evaluation of Alicyclic Backbone Polymers for 193 nm Lithography," *Micro- and Nanopatterning Polymers, ACS Symposium Series 706*, Chapter 16, pp. 208-223.

Onishi et al. (1991), "Acid Catalyzed Resist for KrF Excimer Laser Lithography," *Journal of Photopolymer Science and Technology* 4(3):337-340.

Kunz et al. (1999), "Outlook for 157-nm Resist Design," *Proceedings of SPIE* 3678:13-23.

Lin et al. (1998), "Extension of 248 nm Optical Lithography: A Thin Film Imaging Approach," *Advances in Resist Technology and Processing XV, Proceedings of SPIE* 3333:278-288.

Patterson et al. (2000), "Polymers for 157 nm Photoresist Applications: A Progress Report," *Advances in Resist Technology and Processing XVII, Proceedings of SPIE* 3999:265-374.

Przybilla et al. (1992), "Hexafluoroacetone in Resist Chemistry: A Versatile New Concept for Materials for Deep UV Lithography," *Advances in Resist Technology and Processing IX, Proceedings of SPIE* 1672:500-512.

Reichmanis et al. (1991), "Chemical Amplification Mechanisms for Microlithography," *Chemistry of Materials* 3:394-407.

Schmaljohann et al. (2000), "Design Strategies for 157 nm Single-Layer Photoresists: Lithographic Evaluation of a Poly(α-Trifluoromethyl Vinyl Alcohol) Copolymer," *Advances in Resist Technology and Processing XVII, Proceedings of SPIE* 3999:330-334.

Wilson et al. (1983), "Poly(Methyl α-Trifluoromethylacrylate) as a Positive Electron Beam Resist," *Polymer Engineering and Science* 23(18):1000-1003.

Sooriyakumaran et al. (2001), "Silicon-Containing Resists for 157 nm Applications," *SPIE's 26th Annual International Symposium and Education Program on Microlithography* 4345-35:266.

Sooriyakumaran et al. (2001), "Silicon-Containing Resists for 157 nm Applications," *Proceedings of SPIE □Advances in Resist Technology and Processing XVIII*, 4345(1):319-326.

* cited by examiner

FLUORINATED SILSESQUIOXANE POLYMERS AND USE THEREOF IN LITHOGRAPHIC PHOTORESIST COMPOSITIONS

CROSS-REFERENCE TO RELATED APPLICATIONS

This application is a divisional of U.S. patent application Ser. No. 10/079,289, filed Feb. 19, 2002, which is a continuation-in-part of U.S. patent application Ser. No. 09/748,071, filed Dec. 21, 2000, the disclosures of which are hereby incorporated by reference in their entirety.

TECHNICAL FIELD

This invention relates generally to the fields of polymer chemistry, lithography, and semiconductor fabrication. More particularly, the invention relates to the synthesis of a silicon-containing polymer system with a silsesquioxane (SSQ) backbone that is substantially transparent at 157 nm and is useful in lithographic photoresist compositions, particularly single and bilayer chemical amplification photoresist compositions including ultraviolet, electron-beam, and x-ray photoresists.

BACKGROUND

There is a desire in the industry for higher circuit density in microelectronic devices made using lithographic techniques. One method of increasing the number of components per chip is to decrease the minimum feature size on the chip, which requires higher lithographic resolution. It is known in the art that increasing the numerical aperture (NA) of the lens system of the lithographic imaging tool increases the resolution at a given wavelength. However, increasing the NA results in a decrease in the depth of focus (DOF) of the imaging radiation, thereby requiring a reduction in the thickness of the imaging resist film. A decrease in the resist film thickness can lead to problems in subsequent processing steps (e.g., ion implantation and etching).

In order to overcome these problems, bilayer resists have been developed. Such bilayer resists are generally comprised of a top thin film imaging layer coated on a thick organic underlayer and are patterned by i) imagewise exposure and development of the top layer, and then (ii) anisotropically transferring the developed pattern in the top layer to the thick underlayer and subsequently to the substrate. The top imaging layer contains a suitable refactory oxide precursor such as silicon, boron or germanium that enables the use of oxygen-reactive ion etching (RIE) in the image transfer step.

Additionally, over the past twenty years there has been an industry-wide shift to shorter wavelength exposure systems that also results in a decrease in the DOF. This has been accomplished by reducing the wavelength of the imaging radiation from the visible (436 nm) down through the ultraviolet (365 nm) to the deep ultraviolet (DUV) at 248 nm. Ultra-deep ultraviolet radiation, particularly 193 nm, is now known. See, for example, Allen et al. (1995), "Resolution and Etch Resistance of a Family of 193 nm Positive Resists," *J. Photopolym. Sci. and Tech.* 8(4):623-636, and Abe et al. (1995), "Study of ArF Resistant Material in Terms of Transparency and Dry Etch Resistance," *J. Photopolym. Sci. and Tech.* 8(4):637-642.

However, as the desired feature size decreases, the resolution capability of even these resist is not sufficient to yield sufficiently small features and the next generation of optical lithography tools under development will employ an $F_2$ 157 nm laser as the exposure source. Due to the very poor transparency of conventional resists at this wavelength, new polymer systems will have to be defined. The challenge in developing single and bilayer chemically amplified resists for 157 nm lithography is in achieving suitable transparency in polymers that have acid-labile functionalities or crosslinking groups and thereby convert to materials that are either soluble, when used as a positive resist, or insoluble when used as a negative resist, in industry standard developers.

Studies, such as Kunz et al. (1999), *Proc. SPIE* 13:3678 and Crawford et al. (2000), *Proc. SPIE* 357:3999 have identified two main classes of polymeric materials that are sufficiently transparent at 157 nm to be useful in single and bilayer resists; fluorocarbon polymers, and polysiloxanes (including polysilsesquioxanes). In the case of bilayer resists, siloxanes and silsesquioxanes are particularly advantageous because of their high silicon content. Specifically, polysilsesquioxanes will be ideal candidates for 157 nm bilayer resist development, as well as single layer resist development, because generally they have higher Tg than the polysiloxanes.

Fluorocarbon polymers, such as polymers prepared from trifluoromethyl-substituted acrylates have been described previously. See, for example, Ito et al. (1981), "Methyl Alpha-Trifluoromethylacrylate, an E-Beam and UV Resist," *IBM Technical Disclosure Bulletin* 24(4):991, Ito et al. (1982) *Macromolecules* 15:915-920, which describes preparation of poly(methyl α-trifluoromethylacrylate) and poly(α-trifluoromethylacrylonitrile) from their respective monomers, and Ito et al. (1987), "Anionic Polymerization of α-(Trifluoromethyl)Acrylate," in *Recent Advances in Anionic Polymerization*, T. E. Hogen-Esch and J. Smid, Eds. (Elsevier Science Publishing Co., Inc.), which describes an anionic polymerization method for preparing polymers of trifluoromethylacrylate. Willson et al., *Polymer Engineering and Science* 23(18):1000-1003, also discuss poly(methyl α-trifluoromethylacrylate) and the use thereof in a positive electron beam resist.

Photoresists comprised of silsesquioxane polymers have also been previously described. See, for example, U.S. Pat. No. 6,087,064 to Lin et al., U.S. Pat. No. 5,385,804 to Premlatha et al., U.S. Pat. No. 5,338,818 to Brunsvold et al., and U.S. Pat. No. 5,399,462 to Sachdev et al., which disclose the use of aryl or benzyl substituted polysilsesquioxanes in photoresists. However, none of these references disclose utility of fluorocarbinol and/or fluoroacid functionalized polysilsesquioxanes in 157 nm single and bilayer resist applications.

SUMMARY OF THE INVENTION

Accordingly, it is a primary object of the invention to address the above-described need in the art by providing novel fluorocarbinol- and/or fluoroacid-functionalized silsesquioxane polymers suitable for use in lithographic photoresist compositions.

It is another object of the invention to provide a lithographic photoresist composition containing fluorocarbinol- and/or fluoroacid-functionalized silsesquioxane polymers.

It is yet another object of the invention to provide such a composition wherein the fluorocarbinol- and/or fluoroacid-functionalized silsesquioxane polymer is a copolymer of a fluorocarbinol-functionalized silsesquiokane monomer and a silsesquioxane monomer substituted with an acid cleavable group.

It is yet another object of the invention to provide such a lithographic photoresist composition wherein the photoresist composition is a negative photoresist further comprising a crosslinking agent.

It is yet another object of the invention to provide such a lithographic photoresist composition wherein the photoresist composition is a single layer photoresist.

It is yet another object of the invention to provide such a lithographic photoresist composition wherein the photoresist composition is a bilayer photoresist.

It is still another object of the invention to provide a method for generating a resist image on a substrate using a photoresist composition as described herein.

It is a further object of the invention to provide a method for forming a patterned structure on a substrate by transferring the aforementioned resist image to the underlying substrate material, e.g., by etching.

Additional objects, advantages and novel features of the invention will be set forth in part in the description which follows, and in part will become apparent to those skilled in the art upon examination of the following, or may be learned by practice of the invention.

In one aspect, then, the present invention relates to a fluorocarbinol and/or fluoroacid functionalized silsesquioxane polymer comprised of monomer units having structure (I)

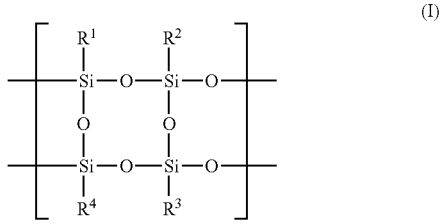

Within structure (II), $R^1$, $R^2$, $R^3$ and $R^4$ are independently selected from the group consisting of substitutents having structure (II)

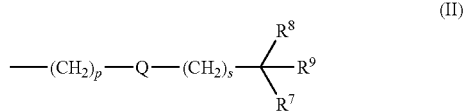

wherein p is 0, 1, or 2, s is 0, 1, or 2, $R^7$ is hydrogen, alkyl or fluoroalkyl, $R^8$ is allyl or fluoroalkyl, $R^9$ is OH, COOH or an acid-cleavable moiety, and Q is selected from the group consisting of substituted (e.g., fluorinated) and unsubstituted arylene, substituted (e.g., fluorinated) and unsubstituted cycloalkylene, substituted and unsubstituted alkarylene, and moieties having the structure (III)

wherein $R^5$ and $R^6$ are independently hydrogen, alkyl (e.g., linear, branched, or cycloalkyl) or fluoroalkyl and n is an integer from 1 to 4. The polymer may serve as either the base-soluble component of an unexposed resist in a negative resist or as an acid-labile material that releases acid following irradiation in a positive resist.

In another aspect of the invention, the present invention relates to a fluorocarbinol and/or fluoroacid functionalized silsesquioxane copolymer comprising monomer units having structure (I), as described above, and monomer units having structure (IV)

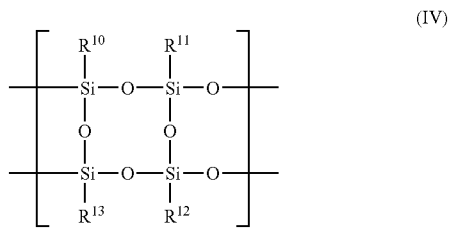

wherein $R^{10}$, $R^{11}$, $R^{12}$ and $R^{13}$ are independently hydrogen, alkyl (e.g., linear, or branched, or cycloalkyl), fluoroalkyl, fluorocarbinol, fluoroacid or an acid-cleavable moiety, with the proviso that at least one of $R^{10}$, $R^{11}$, $R^{12}$ and $R^{13}$ is an acid-cleavable moiety. The copolymer may serve as an acid-labile material that releases acid following irradiation.

In another aspect, the invention relates to a positive lithographic photoresist composition comprising a fluorocarbinol functionalized silsesquioxane polymer or copolymer as described above and a photosensitive acid generator (also referred to herein as a "photoacid generator," a "PAG," or a "radiation-sensitive acid generator").

In another aspect, the invention relates to a negative lithographic photoresist composition comprising a fluorocarbinol-functionalized silsesquioxane polymer as described above and a crosslinking agent.

The present invention also relates to the use of the resist composition in a lithography method. The process involves the steps of (a) optionally coating a substrate with an organic underlayer; (b) coating the organic underlayer with a top layer comprising: i) a radiation sensitive acid generator and ii) a fluorocarbinol fuctionalized silsesquioxane polymer containing polar groups and acid-labile groups; (b) exposing the top layer selectively to a predetermined pattern of radiation to form a latent image therein; (c) developing the image in the top layer using a suitable developer composition; and (e) transferring the image to the substrate. The resist composition may be used to form a single layer photoresist or a bilayer photoresist.

The radiation may be ultraviolet, electron beam or x-ray. Ultraviolet radiation is preferred, particularly deep ultraviolet radiation having a wavelength of less than about 250 nm, e.g., 157 nm, 193 nm, or 248 nm. The pattern from the resist structure may then be transferred to the underlying substrate. Typically, the transfer is achieved by reactive ion etching or some other etching technique. Thus, the compositions of the invention and resulting resist structures can be used to create patterned material layer structures such as metal wiring lines, holes for contacts or vias, insulation sections (e.g., damascene trenches or shallow trench isolation), trenches for capacitor structures, etc., as might be used in the design of integrated circuit devices.

DETAILED DESCRIPTION OF THE INVENTION

Figure 1:
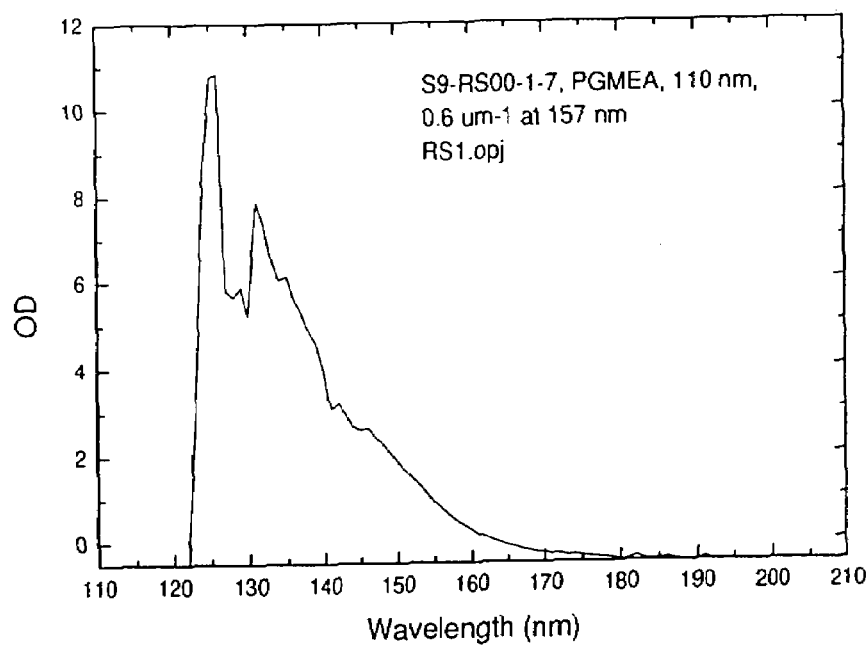
FIG. 1 presents a graph illustrating the optical density of a polymer of the invention at a range of UV wavelengths.
Figure 2:
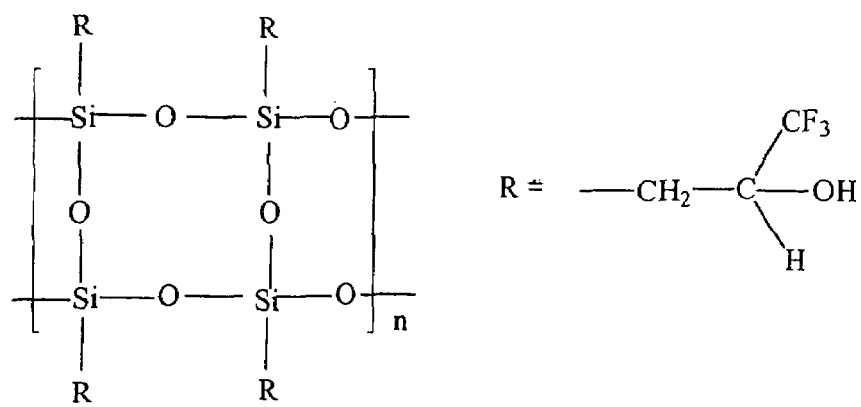
FIG. 2 presents copolymer of the inventions with acid-cleavable pendent groups.

Overview and Definitions:

Before describing the present invention in detail, it is to be understood that this invention is not limited to specific compositions, components or process steps, as such may vary. It is also to be understood that the terminology used herein is for the purpose of describing particular embodiments only and is not intended to be limiting.

It must be noted that, as used in this specification and the appended claims, the singular forms "a," "an" and "the" include plural referents unless the context clearly dictates otherwise. Thus, for example, reference to "a monomer" includes a combination of two or more monomers that may or may not be the same, a "photoacid generator" includes a mixture of two or more photoacid generators, and the like.

In describing and claiming the present invention, the following terminology will be used in accordance with the definitions set out below.

"Optional" or "optionally" means that the subsequently described event or circumstance may or may not occur, and that the description includes instances where said event or circumstance occurs and instances where it does not. For example, the phrase "optionally substituted lower alkyl" means that a lower alkyl moiety may or may not be substituted and that the description includes both unsubstituted lower alkyl and lower alkyl where there is substitution.

The term "alkyl" as used herein refers to a branched or unbranched saturated hydrocarbon group of 1 to 24 carbon atoms, such as methyl, ethyl, n-propyl, isopropyl, n-butyl, isobutyl, t-butyl, octyl, decyl, tetradecyl, hexadecyl, eicosyl, tetracosyl and the like, as well as cycloalkyl groups such as cyclopentyl, cyclohexyl and the like. The term "lower alkyl" intends an alkyl group of 1 to 6 carbon atoms, and the term "lower alkyl ester" refers to an ester functionality —C(O)O—R wherein R is lower alkyl.

The term "alkylene" as used herein refers to a difunctional branched or unbranched saturated hydrocarbon group of 1 to 24 carbon atoms, such as methylene, ethylene, n-propylene, n-butylene, n-hexylene, decylene, tetradecylene, hexadecylene, and the like. The term "lower alkylene" refers to an alkylene group of one to six carbon atoms.

The term "fluorinated" refers to replacement of a hydrogen atom in a molecule or molecular segment with a fluorine atom. The term "fluoroalkyl" refers to an alkyl group wherein at least one hydrogen atom has been replaced with a fluorine atom and includes, for example, trifluoromethyl, difluoromethyl, 2,2,2-trifluoroethyl, pentafluoromethyl, 3,3,3-trifluoromethyl, etc. Similarly, the term "fluorocarbinol" refers to an alcohol moiety in which at least one of the hydrogens bonded to a carbon atom has been replaced with a fluorine atom and includes, for example, —$CF_2OH$, —$CH(CF_3)$—OH, —$C(CF_3)_2$—OH, —$CH_2CF_2OH$, etc. The term "fluoroacid" refers to a carboxylic acid substituent in which at least one of the hydrogens bonded to a carbon atom has been replaced with a fluorine atom and includes, for example, —$CF_2COOH$, —$CH(CF_3)$—COOH, —$C(CF_3)_2$—COOH, —$CH_2CF_2COOH$, etc. The term "perfluorinated" is also used in its conventional sense to refer to a molecule or molecular segment wherein all hydrogen atoms are replaced with fluorine atoms. Unless otherwise indicated, "fluorinated" stubstituents (such as fluoralkyl and the like) include perfluorinated substitutents.

The term "aryl" as used herein refers to an aromatic species containing 1 to 5 aromatic rings, either fused or linked, and either unsubstituted or substituted with 1 or more substitutents typically selected from the group consisting of halogen, alkyl, alkenyl, alkynyl, alkoxy, alkenyloxy, alkynyloxy, alkylthio, aryl, aralkyl, and the like. Preferred aryl substitutents contain 1 to 3 fused aromatic rings, and particularly preferred aryl substitutents contain 1 aromatic ring or 2 fused aromatic rings.

The terms "aralkyl" and "alkaryl" refer to moieties containing both alkyl and aryl species, typically containing less than about 24 carbon atoms, and more typically less than about 12 carbon atoms in the alkyl segment of the moiety, and typically containing 1 to 5 aromatic rings. The rings may be either unsubstituted or substituted with 1 or more substitutents typically selected from the group consisting of halogen, haloalky, alkyl, alkenyl, alkynyl, alkoxy, alkenyloxy, alkynyloxy, alkylthio, aryl, aralkyl, and the like. The term "aralkyl" refers to aryl-substituted alkyl groups, while the term "alkaryl" refers to alkyl-substituted aryl groups. The terms "aralkylene" and "alkarylene" are used in a similar manner to refer to aryl-substituted alkylene and alkyl-substituted arylene moieties.

The term "arylene" refers to a difunctional aromatic moiety; "monocyclic arylene" refers to a cyclopentylene or phenylene group. These groups may be substituted with up to four ring substitutents as outlined above.

The term "polymer" is used to refer to a chemical compound that comprises linked monomers, and that may be linear, branched, or crosslinked.

The terms "photogenerated acid" and "photoacid" are used interchangeably herein to refer to the acid that is created upon exposure of the present compositions to radiation, i.e., as a result of the radiation-sensitive acid generator in the compositions.

The term "substantially transparent" as used to describe a polymer that is "substantially transparent" to radiation of a particular wavelength refers to a polymer that has an absorbance of less than about 4.0/micron, preferably less than about 3.0/micron, most preferably less than about 2.5/micron, at a selected wavelength.

For additional information concerning terms used in the field of lithography and lithographic compositions, reference may be had to *Introduction to Microlithography*, Eds. Thompson et al. (Washington, D.C.: American Chemical Society, 1994).

The Fluorocarbinol- and/or Fluoroacid-Functionalized Silsesquioxane Polymers:

The fluorocarbinol- and/or fluoroacid-functionalized silsesquioxane polymer comprised of a monomer unit having structure (I)

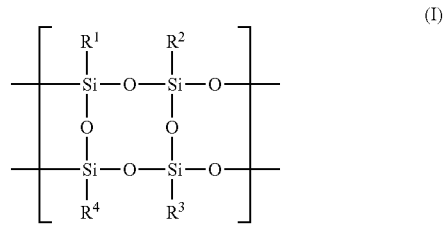

Within structure (I), $R^1$, $R^2$, $R^3$ and $R^4$ are independently selected from the group consisting of substitutents having structure (II)

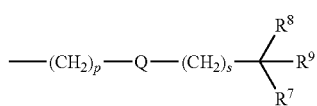

(II)

wherein p is 0, 1, or 2, s is 0, 1, or 2, $R^7$ is hydrogen, linear or branched alkyl, or fluoroalkyl, $R^8$ is alkyl or fluoroalkyl, $R^9$ is OH, COOH or an acid-cleavable moiety, and Q is selected from the group consisting of substituted and unsubstituted arylene, substituted and unsubstituted cycloalkylene, substituted and unsubstituted alkarylene, and moieties having the structure (III)

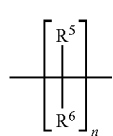

(III)

wherein $R^5$ and $R^6$ are independently hydrogen, alkyl (e.g., linear, branched, or cycloalkyl) or fluoroalkyl and n is an integer from 1 to 4.

Preferred $R^5$ and $R^6$ substitutents are hydrogen, $C_1$-$C_6$ alkyl and $C_1$-$C_6$ fluoroalkyl. Most preferred $R^5$ and $R^6$ substitutents are hydrogen, methyl, ethyl and trifluoromethyl-substituted $C_1$-$C_6$ alkyl, such as trifluoromethyl, 2,2,2-trifluoroethyl, and 3,3,3-trifluoromethyl.

Preferred $R^7$ substitutents are hydrogen, $C_1$-$C_6$ alkyl and $C_1$-$C_6$ fluoroalkyl. Most preferred $R^7$ substitutents are hydrogen, methyl, ethyl and trifluoromethyl-substituted $C_1$-$C_6$ alkyl, such as trifluoromethyl, 2,2,2-trifluoroethyl, and 3,3,3-trifluoromethyl.

Preferred $R^8$ substitutents are $C_1$-$C_6$ alkyl and $C_1$-$C_6$ fluoroalkyl. Most preferred $R^8$ substitutents are methyl, ethyl and trifluoromethyl-substituted $C_1$-$C_6$ alkyl, such as trifluoromethyl, 2,2,2-trifluoroethyl, and 3,3,3-trifluoromethyl.

In structure (II) substitutent, the $R^9$ moiety is —OH, —COOH, or an acid-cleavable moiety, i.e., a molecular moiety that is cleavable with acid, particularly photogenerated acid. Suitable acid-cleavable functionalities include, but are not limited to, esters of the formula -(L)$_v$-(CO)—OR$^{14}$, carbonates of the formula -(L)$_v$-O—(CO)—O—R$^{15}$, and ethers of the formula —OR$^{16}$, wherein $R^{14}$, $R^{15}$ and $R^{16}$ are selected so as to render the functionality acid-cleavable, v is zero or 1, and L is a linking group such as an alkylene group (e.g., linear, branched or cycloalkylene group such as norbornyl or cyclohexylene) a fluoroalkylene group, or an aryl group. In acid-cleavable ester groups, i.e., substitutents having the formula -(L)$_v$-(CO)—OR$^{14}$, $R^{14}$ is preferably either a tertiary alkyl, e.g., t-butyl, a cyclic or alicyclic substitutent (generally $C_7$-$C_{12}$) with a tertiary attachment point such as adamantyl, norbornyl, isobornyl, 2-methyl-2-adamantyl, 2-methyl-2-isobornyl, 2-butyl-2-adamantyl, 2-propyl-2-isobornyl, 2-methyl-2-tetracyclododecenyl, 2-methyl-2-dihydrodicyclopentadienyl-cyclohexyl, 1-methylcyclopentyl or 1-methylcyclohexyl, or a 2-trialkylsilylethyl group, such as 2-trimethylsilyethyl, or 2-triethylsilylethyl.

Other examples of such acid-cleavable ester groups are set forth in U.S. Pat. No. 4,491,628 to Ito et al., entitled "Positive- and Negative-Working Resist Compositions with Acid-Generating Photoinitiator and Polymer with Acid Labile Groups Pendant from Polymer Backbone," and in the *Handbook of Microlithography, Micromachining, and Microfabrication, Vol. 1: Microlithography*, Ed. P. Raj-Coudhury, p. 321 (1997). An exemplary acid-cleavable carbonate, i.e., a substitutent having the formula —O—(CO)—O—R$^{15}$, is —O-t-butyloxycarbonyl(t-BOC) (in which case $R^{15}$ is t-butyl), and exemplary ethers, i.e., —OR$^{16}$ moieties, are tetrahydropyranyl ether (in which case $R^{16}$ is tetrahydropyranyl) and trialkylsilyl ethers (in which case $R^{16}$ is a trialkhylsilyl such as trimethylsilyl). Other suitable acid-labile protecting groups may be found in U.S. Pat. No. 5,679,495 to Yamachika et al. or in the pertinent literature and texts, e.g., Greene et al., Protective Groups in Organic Synthesis, 2$^{nd}$ Ed. (New York: John Wiley & Sons, 1991).

Preferred acid-cleavable pendant groups are organic ester groups that undergo a cleavage reaction in the presence of photogenerated acid to generate a carboxylic acid group. Thus, in a preferred embodiment, $R^9$ is -(L)$_v$-(CO)—OR$^{14}$ wherein L, n and $R^{14}$ are as defined above.

Example substitutents having structure (II) include, but are not limited to,

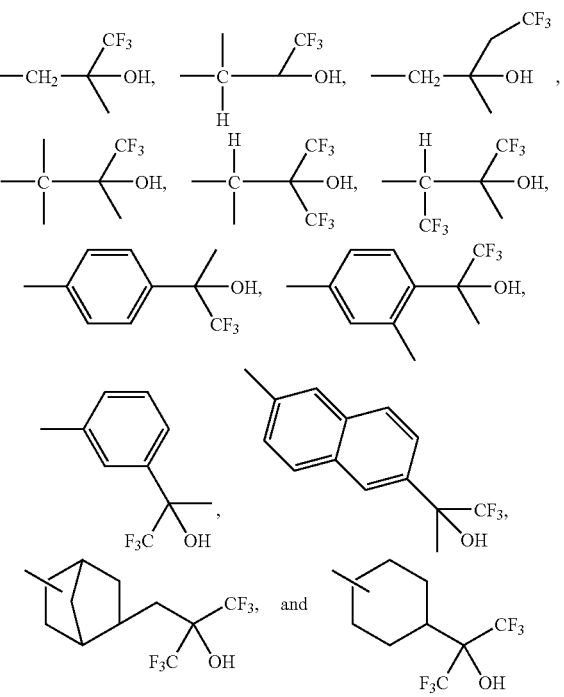

Additionally, the structure (I) monomer units may be used to form a fluorocarbinol-functionalized copolymer comprised of structure (I) monomer units and monomer units having structure (IV)

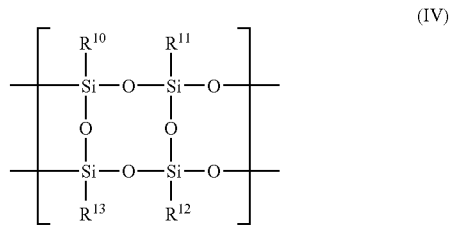

(IV)

in which $R^{10}$, $R^{11}$, $R^{12}$ and $R^{13}$ are independently hydrogen, alkyl (e.g., linear, branched, or cycloalkyl), fluoroalkyl, fluorocarbinol, fluoroacid, or an acid-cleavable moiety, with the proviso that at least one of $R^{10}$, $R^{11}$, $R^{12}$ and $R^{13}$ is an acid-cleavable moiety. It will be apparent from the structures and aforementioned definitions that these monomer units may or may not be fluorinated. The silsesquioxane polymers and copolymers represented by structures (I) and (IV) are not limited to any particular architecture or structure. It is intended to include all possible architectures and structures of the polymer including random copolymers, block copolymers, ladder structures, cage structures, partial cage structures, and random SSQ structures.

The polymer and copolymer may comprise different monomer units each having structure (I), and, in the case of the copolymer, different monomer units each having structure (IV). The polymer and copolymer may also comprise one or more other monomer units, typically formed from addition polymerizable monomers, preferably vinyl monomers, for example, to enhance the performance of the photoresist. Thus, the polymer and copolymer may comprise minor amounts of acrylic acid or methacrylic acid monomer (e.g., 5-30%) to enhance development.

The polymer and copolymer may also comprise other suitable monomer units such as hydroxystyrene to enhance development and etch resistance or a silicon-containing monomer unit (e.g., a silicon-containing acrylate, methacrylate, or styrene) to enhance oxygen plasma etch resistance for bilayer applications. In general, suitable comonomers include, but are not limited to, the following ethylenically unsaturated polymerizable monomers: acrylic and methacrylic acid esters and amides, including alkyl acrylates, aryl acrylates, alkyl methacrylates and aryl methacrylates (for example, methyl acrylate, methyl methacrylate, n-butyl acrylate, n-butyl methacrylate, t-butyl acrylate, t-butyl methacrylate, 2-ethylhexyl methacrylate, benzyl acrylate and N-phenylacrylamide); vinyl aromatics, including unsubstituted styrene and styrene substituted with one or two lower alkyl, halogen or hydroxyl groups (for example, styrene derivatives such as 4-vinyltoluene, 4-vinylphenol, α-methylstyrene, 2,5-dimethylstyrene, 4-t-butylstyrene and 2-chlorostyrene); butadiene; vinyl acetate; vinyl bromide; vinylidene chloride; and $C_5$-$C_{20}$, generally $C_7$-$C_{15}$, cyclic olefin monomers such as norbornene and tetracyclododecane; fluorinated analogs of any of the foregoing, e.g., fluorinated acrylic and methacrylic acid esters; and others readily apparent to one skilled in the art. For use in 157 nm lithography, fluorinated comonomers are preferred.

Monomer Synthesis and Polymerization:

The present polymers and copolymers may be readily synthesized using methods described in the pertinent texts and literature, or as known to those of ordinary skill in the art. Methods for synthesizing representative monomers are described in the examples, as are methods for preparing the fluorocarbinol-functionalized silsesquioxane polymers and copolymers. As illustrated in the Examples, the polymers are generally formed in a multi-step process. First, a protected version of a desired structure (II) substitutent (e.g., wherein an OH or COOH is esterified) is reacted with a trihalosilane to form a protected structure (II)-substituted trihalosilane. Next, the substituted trihalosilane is hydrolyzed and the resulting compound polymerized via condensation polymerization to form a protected version of the polymer or copolymer. Finally, the protecting group is removed thus resulting in the final polymer or copolymer. The resulting polymer or copolymer typically has an average molecular weight in the range of approximately 500 to 25,000, and generally in the range of approximately 1,000 to 5,000.

The Photoacid Generator:

The second component of the resist composition is a photoacid generator. Upon exposure to radiation, the photoacid generator generates a strong acid. A variety of photoacid generators can be used in the composition of the present invention. Generally, suitable acid generators have a high thermal stability (preferably to temperatures greater than 140° C.) so they are not degraded during pre-exposure processing. Generally, sulfonate compounds are preferred PAGs, particularly sulfonate salts, but other suitable sulfonate PAGs include sulfonated esters and sulfonyloxy ketones. See U.S. Pat. No. 5,344,742 to Sinta et al., and *J. Photopolymer Science and Technology*, 4:337-340 (1991), for disclosure of suitable sulfonate PAGs, including benzoin tosylate, t-butylphenyl-α-(p-toluenesulfonyloxy)-acetate and t-butyl α-(p-toluenesulfonyloxy)-acetate.

Onium salts are also generally preferred acid generators of compositions of the invention. Onium salts that are weakly nucleophilic anions have been found to be particularly suitable. Examples of such anions are the halogen complex anions of divalent to heptavalent metals or non-metals, for example, Sb, B, P, and As. Examples of suitable onium salts are aryl-diazonium salts, halonium salts, aromatic sulfonium salts, aromatic sulfoxonium salts, and selenium salts (e.g., triarylsulfonium and diaryliodonium hexafluoroantimonates, hexafluoroarsenates, trifluoromethanesulfonates and others). Examples of suitable preferred onium salts can be found in U.S. Pat. Nos. 4,442,197, 4,603,101, and 4,624,912.

Other useful acid generators include the family of nitrobenzyl esters and the s-triazine derivatives. Suitable s-triazine acid generators are disclosed, for example, in U.S. Pat. No. 4,189,323.

Still other suitable acid generators include N-camphorsulfonyloxynaphthalimide, N-pentafluorophenylsulfonyloxynaphthalimide, ionic iodonium sulfonates, e.g., diaryl iodonium (alkyl or aryl)sulfonate and bis-(di-t-butylphenyl) iodonium camphanylsulfonate, perfluoroalkanesulfonates, such as perfluoropentanesulfonate, perfluorooctanesulfonate, perfluoromethanesulfonate; aryl (e.g., phenyl or benzyl)triflates and derivatives and analogs thereof, e.g., triphenylsulfonium triflate or bis-(t-butylphenyl)iodonium triflate; pyrogallol derivatives (e.g., trimesylate of pyrogallol); trifluoromethanesulfonate esters of hydroxyimides, α, α'-bis-sulfonyl-diazomethanes; sulfonate esters of nitro-substituted benzyl alcohols; naphthoquinone-4-diazides; and alkyl disulfones. Other suitable photoacid generators are disclosed in Reichmanis et al. (1991), *Chemistry of Materials* 3:395, and in U.S. Pat. No. 5,679,495 to Yamachika et al. Additional suitable acid generators useful in conjunction with the compositions and methods of the invention will be known to those skilled in the art and/or are described in the pertinent literature.

The Photoresist Composition:

The photoresist composition herein comprises both a fluorocarbinol- and/or fluoroacid-functionalized silsesquioxane polymer or copolymer as described in detail above, and an acid generator, with the polymer or copolymer representing up to about 99.5 wt. % of the solids included in the composition, and the photoacid generator representing approximately 0.5-10 wt. % of the solids contained in the composition. The photoresist may take the form a negative or a positive photoresist and other components and additives may also be present.

If the photoresist is a positive photoresist, the composition may include a monomeric or polymeric acid-cleavable dissolution inhibitor. When the resist-coated substrate is patternwise exposed to a radiation source, the acid generated by the radiation-sensitive acid generator will cleave the acid-cleavable moieties in the polymer or copolymer and/or in the dissolution inhibitor, thus making the exposed areas of the photoresist composition soluble in conventional developer solutions. If included, the dissolution inhibitor, may be present either as pendent moiety on the polymer or copolymer chain, as an additional element in the photoresist composition, or as a combination of the two. If a dissolution inhibitor is present, it will typically represent in the range of about 1 wt. % to 40 wt. %, preferably about 5 wt. % to 30 wt. %, of the total solids. Positive photoresist compositions that comprise a dissolution inhibitor need not have acid-cleavable moieties on the silsesquioxane polymer, i.e. $R^9$ need not be an acid-labile group, as the dissolution inhibitor will independently be sufficient to result in the dissolution of the exposed areas of resist.

Suitable dissolution inhibitors are known to those skilled in the art and/or described in the pertinent literature. Preferred dissolution inhibitors have high solubility in the resist composition and the solvent used to prepare solutions of the resist composition (e.g., propylene glycol methyl ether acetate, or "PGMEA"), exhibit strong dissolution inhibition, have a high exposed dissolution rate, are transparent at the wavelength of interest, exhibit a moderating influence on $T_g$, strong etch resistance, and display good thermal stability (i.e., stability at temperatures of about 140° C. or greater). Both polymeric and monomeric dissolution inhibitors may be used in the photoresist composition of the invention.

Suitable dissolution inhibitors include, but are not limited to, bisphenol A derivatives and carbonate derivatives wherein the hydroxyl group of bisphenol A (Bis-A) is replaced by tert-butyl derivative substitutents such as tert-butyloxy, tert-butyloxycarbonyl, and tert-butyloxycarbonyl-methyl groups; fluorinated bisphenol A derivatives such as $CF_3$-Bis-A/tBuO-$COCH_3$ (6F-Bisphenol A protected with a t-butoxycarbonyl-methyl group); linear or branched chain acetal groups such as 1-ethoxyethyl, 1-propoxyethyl, 1-n-butoxyethyl, 1-isobutoxy-ethyl, 1-tert-butyloxyethyl, and 1-tert-amyloxyethyl groups; and cyclic acetal groups such as tetrahydrofuranyl, tetrahydropyranyl, and 2-methoxytetrahydropyranyl groups; and androstane-17-alkylcarboxylates and analogs thereof, wherein the 17-alkylcarboxylate at the 17-position is typically lower alkyl. Examples of such compounds include lower alkyl esters of cholic, ursocholic and lithocholic acid, including methyl cholate, methyl lithocholate, methyl ursocholate, t-butyl cholate, t-butyl lithocholate, t-butyl ursocholate, and the like (see, e.g., Allen et al. (1995) *J. Photopolym. Sci. Technol.*, cited supra); hydroxyl-substituted analogs of such compounds (ibid.); and androstane-17-alkylcarboxylates substituted with 1 to 3 $C_1$-$C_4$ fluoroalkyl carbonyloxy substitutents, such as t-butyl trifluoroacetyllithocholate (see, e.g., U.S. Pat. No. 5,580,694 to Allen et al.).

In the event the composition is to be used as a negative photoresist, the composition will include a crosslinking agent. When the resist-coated substrate is exposed to radiation, the acid produced by the radiation-sensitive acid generator in the exposed areas will cause the crosslinking agent to react with the polymers of the invention, thus making the exposed regions insoluble in developer solution. As with dissolution inhibitors the crosslinking agent, when present, will typically represent in the range of about 1 wt. % to 40 wt. %, preferably about 5 wt. % to 30 wt. %, of the total solids. Dissolution inhibitors are not included in negative photoresists nor are crosslinking agents included in positive photoresists.

The crosslinking agent may be any suitable crosslinking agent known in the negative photoresist art that is otherwise compatible with the other components of the photoresist composition. The crosslinking agent preferably acts to crosslink the polymer component in the presence of a generated acid. Preferred crosslinking agents are glycoluril compounds such as tetramethoxymethyl glycoluril, methylpropyltetramethoxymethyl glycoluril, and methylphenyltetramethoxymethyl glycoluril, available under the POWDERLINK® trademark from American Cyanamid Company. Other possible crosslinking agents include, but are not limited to: 2,6-bis(hydroxymethyl)-p-cresol and compounds having the following structures:

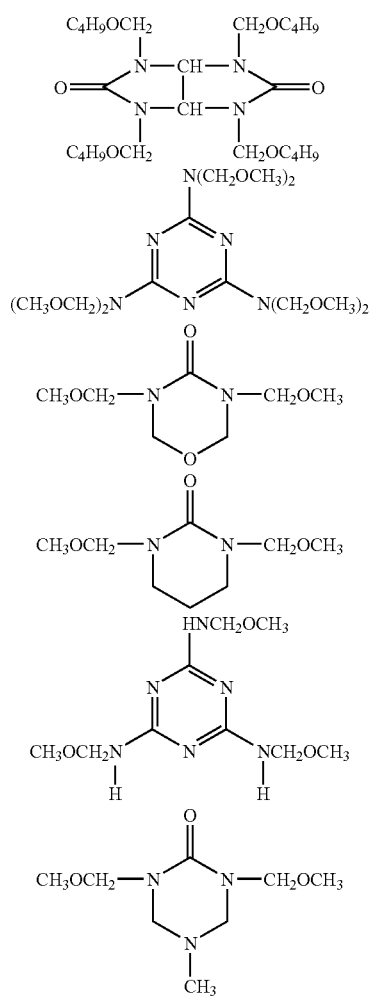

including their analogs and derivatives, such as those found in Japanese Laid-Open Patent Application (Kokai) No. 1-293339, as well as etherified amino resins, for example, methylated or butylated melamine resins (N-methoxymethyl- or N-butoxymethyl-melamine respectively) or methylated/butylated glycolurils, for example as can be found in Canadian Patent No. 1 204 547. Combinations of crosslinking agents may be used.

The remainder of the composition is composed of a solvent and may additionally, if necessary or desirable, include customary additives such as dyes, sensitizers, additives used as stabilizers and acid-diffusion controlling agents, coating aids such as surfactants or anti-foaming agents, adhesion promoters and plasticizers.

The choice of solvent is governed by many factors not limited to the solubility and miscibility of resist components, the coating process, and safety and environmental regulations. Additionally, inertness to other resist components is desirable. It is also desirable that the solvent possess the appropriate volatility to allow uniform coating of films yet also allow significant reduction or complete removal of residual solvent during the post-application bake process. See, e.g., *Introduction to Microlithography*, Eds. Thompson et al., cited previously. Solvents may generally be chosen from ether-, ester-, hydroxyl-, and ketone-containing compounds, or mixtures of these compounds. Examples of appropriate solvents include cyclopentanone, cyclohexanone, lactate esters such as ethyl lactate, alkylene glycol alkyl ether esters such as propylene glycol methyl ether acetate, alkylene glycol monoalkyl esters such as methyl cellosolve, butyl acetate, 2-ethoxyethanol, and ethyl 3-ethoxypropionate. Preferred solvents include ethyl lactate, propylene glycol methyl ether acetate, ethyl 3-ethoxypropionate and their mixtures.

The above list of solvents is for illustrative purposes only and should not be viewed as being comprehensive nor should the choice of solvent be viewed as limiting the invention in any way. Those skilled in the art will recognize that any number of solvents or solvent mixtures may be used. Greater than 50 percent of the total mass of the resist formulation is typically composed of the solvent, preferably greater than 80 percent.

Other customary additives include dyes that may be used to adjust the optical density of the formulated resist and sensitizers which enhance the activity of photoacid generators by absorbing radiation and transferring it to the photoacid generator. Examples include aromatics such as functionalized benzenes, pyridines, pyrimidines, biphenylenes, indenes, naphthalenes, anthracenes, coumarins, anthraquinones, other aromatic ketones, and derivatives and analogs of any of the foregoing.

A wide variety of compounds with varying basicity may be used as stabilizers and acid-diffusion controlling additives. They may include nitrogenous compounds such as aliphatic primary, secondary, and tertiary amines, cyclic amines such as piperidines, pyrimidines, morpholines, aromatic heterocycles such as pyridines, pyrimidines, purines, imines such as diazabicycloundecene, guanidines, imides, amides, and others. Ammonium salts may also be used, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed.

Surfactants may be used to improve coating uniformity, and include a wide variety of ionic and non-ionic, monomeric, oligomeric, and polymeric species. Likewise, a wide variety of anti-foaming agents may be employed to suppress coating defects. Adhesion promoters may be used as well; again, a wide variety of compounds may be employed to serve this function. A wide variety of monomeric, oligomeric, and polymeric plasticizers such as oligo- and polyethyleneglycol ethers, cycloaliphatic esters, and non-acid reactive steroidally-derived materials may be used as plasticizers, if desired.

However, neither the classes of compounds nor the specific compounds mentioned above are intended to be comprehensive and/or limiting. One versed in the art will recognize the wide spectrum of commercially available products that may be used to carry out the types of functions that these customary additives perform.

Typically, the sum of all customary additives (not including the PAG) will comprise less than 20 percent of the solids included in the resist formulation, and preferably less than 5 percent.

Use in Generation of Resist Images on a Substrate:

The present invention also relates to a process for generating a resist image on a substrate comprising the steps of: (a) coating a substrate with a film comprising the resist composition of the present invention; (b) imagewise exposing the film to radiation; and (c) developing the image. The first step involves coating the substrate with a film comprising the resist composition dissolved in a suitable solvent. Suitable substrates are ceramic, metallic or semiconductive, and preferred substrates are silicon-containing, including, for example, silicon dioxide, silicon nitride, and silicon oxynitride. The substrate may or may not be coated with an organic anti-reflective layer prior to deposition of the resist composition. Alternatively, a bilayer substrate may be employed wherein a resist composition of the invention forms an upper resist layer (i.e., the imaging layer) on top of a bilayer substrate comprised of a base layer and underlayer that lies between the upper resist layer and the base layer. The base layer of the bilayer substrate is comprised of a suitable substrate material, and the underlayer of the bilayer substrate is comprised of a material that is highly absorbing at the imaging wavelength and compatible with the imaging layer. Conventional underlayers include cross-linked poly(hydroxystyrene), polyesters, polyacrylates, fluorinated polymers, cyclic-olefin polymers and the like including diazonapthoquinone (DNQ)/novolak resist material.

Preferably, the surface of the coated or uncoated, single or bilayer substrate is cleaned by standard procedures before the film is deposited thereon. Suitable solvents for the composition are as described in the preceding section, and include, for example, cyclohexanone, ethyl lactate, and propylene glycol methyl ether acetate. The film can be coated on the substrate using art-known techniques known in the art, such as spin or spray coating, or doctor blading. Preferably, before the film has been exposed to radiation, the film is heated to an elevated temperature of about 90-160° C. for a short period of time, typically on the order of about 1 minute. The dried film has a thickness of about 0.01 to about 5.0 microns, preferably about 0.02 to about 2.5 microns, more preferably about 0.05 to about 1.0 microns, and most preferably about 0.10 to about 0.20 microns.

In the second step of the process, the film is imagewise exposed to radiation, i.e., UV, X-ray, e-beam, EUV, or the like. Preferably, ultraviolet radiation having a wavelength of about 157 nm to about 365 nm is used and most preferably ultraviolet radiation having a wavelength of about 157 nm or about 193 nm is used. Suitable radiation sources include mercury, mercury/xenon, and xenon lamps. The preferred radiation source is a KrF excimer laser or a $F_2$ excimer laser. If longer wavelength radiation is used, e.g., 365 nm, a sensitizer may be added to the photoresist composition to enhance absorption of the radiation. Conveniently, due to the enhanced radiation sensitivity of the photoresist composition, full exposure of the photoresist composition is achieved with less than about 100 mJ/cm$^2$ of radiation, more preferably with less than about 50 mJ/cm$^2$ of radiation.

The radiation is absorbed by the radiation-sensitive acid generator to generate free acid. In positive photoresists, with heating, the free acid causes cleavage of the acid-cleavable pendant groups that are present as either the $R^9$ moiety in the structure (II) substitutent and/or as $R^{10}$, $R^{11}$, $R^{12}$ or $R^{13}$ in the structure (IV) monomer, resulting in the formation of the corresponding carboxylic acid. In negative photoresists, the free acid causes the crosslinking agents to react with the polymer, thereby forming insoluble areas of exposed photoresist. Preferably, after the photoresist composition has been exposed to radiation, the photoresist composition is again heated to an elevated temperature of about 90-150° C. for a short period of time, on the order of about 1 minute.

The third step involves development of the image with a suitable solvent. Suitable solvents include an aqueous base, preferably an aqueous base without metal ions such as the industry standard developer tetramethylammonium hydroxide or choline. In positive photoresist applications, the exposed areas of the photoresist will be soluble, leaving behind the unexposed areas. In negative photoresist, the converse is true, i.e., the unexposed regions will be soluble to the developer while the exposed regions will remain. Because the fluorocarbinol- and/or fluoroacid-functionalized silsesquioxane monomer of the photoresist composition is substantially transparent at 157 nm, the resist composition is uniquely suitable for use at that wavelength. However, as stated before, the resist may also be used with wavelengths of 193 nm, 248 nm, 254 nm and 365 nm, or with electro beam or x-ray radiation.

The pattern from the resist structure may then be transferred to the material of the underlying substrate. In coated or bilayer photoresists, this will involve transferring the pattern through and coating that may be present and through the underlayer onto the base layer. In single layer photoresists the transfer will be made directly to the substrate. Typically, the pattern is transferred by etching with reactive ions such as oxygen, plasma, and/or oxygen/sulfurdioxide plasma. Suitable plasma tools include, but are not limited to, electron cyclotron resonance (ECR), helicon, inductively coupled plasma, (ICP) and transmission-coupled plasma (TCP) system. Etching techniques are well known in the art and one skilled in the art will be familiar with the various commercially available etching equipment.

Thus, the compositions of the invention and resulting resist structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices.

Accordingly, the processes for making these features involves, after development with a suitable developer as above, etching the layer(s) underlying the resist layer at spaces in the pattern whereby a patterned material layer or substrate section is formed, and removing any remaining resist from the substrate. In some single layer instances, a hard mask may be used below the resist layer to facilitate transfer of the pattern to a further underlying material layer or section. In the manufacture of integrated circuits, circuit patterns can be formed in the exposed areas after resist development by coating the substrate with a conductive material, e.g., a metallic material, using known techniques such as evaporation, sputtering, plating, chemical vapor deposition, or laser-induced deposition. Dielectric materials may also be deposited by similar means during the process of making circuits. Inorganic ions such as boron, phosphorous, or arsenic can be implanted in the substrate in the process for making p-doped or n-doped circuit transistors. Examples of such processes are disclosed in U.S. Pat. Nos. 4,855,017, 5,362,663, 5,429,710, 5,562,801, 5,618,751, 5,744,376, 5,801,094, and 5,821,469. Other examples of pattern transfer processes are described in Chapters 12 and 13 of Moreau, *Semiconductor Lithography, Principles, Practices, and Materials* (Plenum Press, 1988). It should be understood that the invention is not limited to any specific lithographic technique or device structure.

It is to be understood that, while the invention has been described in conjunction with the preferred specific embodiments thereof, the foregoing description as well as the examples which follow are intended to illustrate and not limit the scope of the invention. Other aspects, advantages and modifications within the scope of the invention will be apparent to those skilled in the art to which the invention pertains.

All patents, patent applications, and publications mentioned herein are hereby incorporated by reference in their entirety.

Experimental:

The following examples are put forth so as to provide those of ordinary skill in the art with a complete disclosure and description of how to prepare and use the compositions disclosed and claimed herein. Efforts have been made to ensure accuracy with respect to numbers (e.g., amounts, temperature, etc.) but some errors and deviations should be accounted for. Unless indicated otherwise, parts are parts by weight, temperature is in ° C. and pressure is at or near atmospheric. Additionally, all starting materials were obtained commercially or synthesized using known procedures. Measurements: NMR spectra were recorded on Varian T-60 ($^1$H), Varian CFT-20 ($^1$H and $^{13}$C), IBM NR-80 ($^{19}$F) and Bruker AF250 ($^1$H and $^{13}$C) spectrometers. Gel permeation chromatography (GPC) was performed with a Waters Model 150 chromatograph equipped with six μ-Styragel columns. Measurements were made at 30° C. and 40° C. in THF (PMTFMA and copolymers). Combustion analyses were performed by Childers Laboratories, Milford, N.J., and by Chemical Analytical Services, University of California, Berkeley, Calif.

EXAMPLE 1

Synthesis of Poly(2-hydroxy-3,3,3-trifluoropropyl-silsesquioxane)

A. Synthesis of 2-Acetoxy-3,3,3-Trifluoropropyltrichlorosilane:

1-(Trifluoromethyl)ethenyl acetate (Aldrich, 188.0 grams, 1.22 mole), trichlorosilane (80.6 grams, 0.60 mole), and 200 ml heptane were placed in a round bottom flask equipped with a water condenser and nitrogen inlet. Platinum(O)-1,3-divinyl-1,1,3,3-tetramethyldisiloxane complex in xylene (10 ml) was added to this solution and heated to reflux for 18 hours. Afterwards, the solution was cooled to room temperature and additional portions of trichlorosilane (80.6 grams, 0.60 mole) and platinum complex (5 ml) were added and heated to reflux for 48 hours. Proton NMR of the solution indicated about 75% conversion. A third portion of trichlorosilane (67.7 grams, 0.50 mole) and platinum complex (5 ml) were then added and the solution heated to reflux for 48 hours. Solvents were distilled off at atmospheric pressure and the residue was fractionally distilled under reduced pressure. 2-Acetoxy-3,3,3-trifluoropropyltrichlorosilane (251.7 grams) (1.A) was collected between 100-125° C. at 20 mm pressure as a clear liquid.

B. Hydrolysis of 2-Acetoxy-3,3,3-Trifluoropropyltrichlorosilane:

2-Acetoxy-3,3,3-trifluoropropyltrichlorosilane (29 grams, 0.1 mole) in tetrahydrofuran (THF, 30 ml) was added dropwise into a cold solution (ice/water bath) of diethylamine (24.1 grams, 0.33 mole) and water (30 ml). The mixture was stirred at room temperature for 1 hour. The mixture was then diluted with ether (100 ml) and the organic phase separated. The water phase was extracted with ether (2×25 ml) and the organic solutions were combined. The combined organic solution washed with brine (150 ml) and dried over anhydrous magnesium sulfate. The solvent was removed by rotary evaporation and the product dried under vacuum (19.0 grams).

C. Synthesis of Poly(2-Acetoxy-3,3,3-Trifluoropropylsilsesquioxane):

The product from step 1.B was dissolved in toluene (19 grams) and placed in a round bottom flask equipped with a Dean-Stark water separator (to remove the water produced during condensation-reaction) and a water condenser. To this solution, potassium hydroxide (38 mg) was added and the mixture was heated for 18 hours. Afterwards, the solution was filtered through a frit funnel and the solvent was removed in a rotary evaporator. The polymer was then dried under vacuum (16.5 grams).

D. Synthesis of Poly(2-Hydroxy-3,3,3-Trifluoropropylsilsesquioxane)

Methanol (50 ml) and ammonium hydroxide (30% solution in water, 11 ml) were added to the polymer product of step 1.C and the resultant solution heated to mild reflux for 1 hour. The solution was then cooled to room temperature and added dropwise into a mixture of water (735 ml) and concentrated hydrochloric acid (15 ml). The resultant precipitated polymer (coagulated) was separated by decantation, rinsed with water (2×100 ml) and dried in a vacuum oven at 80° C. for two hours. This polymer was then powdered, transferred into a frit funnel and washed with water (3×100 ml). Then it was dried in a vacuum oven at 80° C. for 24 hours. Yield: 8.5 grams, Mw 3,500. Optical Density (OD) of this polymer as thin film is 0.6/micrometer.

EXAMPLE 2

Poly(2-Hhydroxy-3.3.3-Trifluoropropylsilsesquioxane-co-5-(2-Trimethylsilylethoxycarbonyl) Norbornyisilsesquioxane)(90:10)

A. Synthesis of 5-(2-trimethylsilylethoxycarbonyl)norbonyltrichlorosilane

2-Trimethylsilylethyl 5-norbornene-2-carboxylate (synthesized using known procedures described in U.S. Pat. No. 5,985,524 to Allen et al., 23.8 grams, 0.1 mole) and trichlorosilane (10.8 grams, 0.08 mole) were placed in a round bottom flask equipped with a water condenser and nitrogen inlet. The contents were cooled in ice/water bath and platinum(O)-1,3-divinyl-1,1,3,3-tetramethyl disiloxane complex in xylene (100 ml) was added and stirred. After two hours, the bath was removed and the contents stirred at room temperature for 18 hours. Proton NMR spectrum of the mixture indicated only 50% conversion. The contents were again cooled in the water ice bath and trichlorosilane (6.8 grams, 0.05 mole) and platinum(O)-1,3-divinyl-1,1,3,3-tetramethyldisiloxane complex in xylene (100 ml) were added and stirred. After two hours, the bath was removed and the contents stirred at room temperature for 18 hours. Afterwards, the volatiles were removed under vacuum. The colorless liquid thus obtained contained 92% of the desired product 5-(2-trimethylsilylethoxycarbonyl)norbonyltrichlorosilane (2.A) and 8% of the starting material, 2-trimethylsilylethyl 5-norbornene-2-carboxylate. As the starting material would not react in the next step of the reaction, further purification was not necessary.

B. Hydrolysis of the Monomer Mixtures

2-Acetoxy-3,3,3-trifluoropropyltrichlorosilane (1.A above) and 5-(2-trimethylsilylethoxycarbonyl) norbonyltrichlorosilane were mixed together in a molar ratio of 90:10 and hydrolyzed as described in 1.B above.

C. Synthesis of Poly(2-Acetoxy-3,3,3-Trifluoropropylsilsesquioxane-Co-5-(2-Trimethylsilylethoxycarbonyl) Norbornylsilsesquioxane)

The product from step 2.B was condensed to give the desired polymer as described in step 1.C.

D. Synthesis of Poly(2-Hydroxy-3,3,3-trifluoropropylsilsesquioxane-co-5-(2-Trimethylsilyiethoxycarbonyl) Norbornylsilsesquioxane)

The product from step 2.C was reacted with ammonium hydroxide as described in step 1.D and the resulting polymer was precipitated into a water/aceitic acid mixture.

EXAMPLE 3

Poly[5-{2-(1',1',1'-Trifluoro-2'-Trifluoromethyl-2'-Hydroxy)} Norbornylsilsesquioxane]

A. 5-[2-(1',1',1'-Trifluoro-2'-Trifluoromethyl-2'-Acetoxy)] Norbornyltrichlorosilane:

2-(1',1',1'-Trifluoro-2'-trifluoromethyl-2'-acetoxy)-5-norbornene, (49 grams, 0.155 mole), trichlorosilane (29.4 grams, 0.22 mole), and 200 ml hexane were placed in a round bottom flask equipped with a water condenser and nitrogen inlet. Platinum(0)-1,3-divinyl-1,1,3,3-tetramethyldisiloxane complex in xylene (4 ml) was added to this solution and heated to reflux for 18 hours. The volatiles were then removed by distillation at atmospheric pressure and the residue fractionally distilled under reduced pressure. The product, 5-[2-(1',1',1'-trifluoro-2'-trifluoromethyl-2'-acetoxy)] norbornyltrichlorosilane (60.08 grams) was collected between 130-155° C. at 2 mm pressure as a clear liquid.

B. Hydrolysis of 5-[2-(1',1',1'-trifluoro-2'-Trifluoromethyl-2'-Acetoxy)]Norbornyltrichlorosilane 5-[2-(1',1',1'-Trifluoro-2'-trifluoromethyl-2'-acetoxy)] norbornyltrichlorosilane (32.5 grams, 0.07 mole) in tetrahydrofuran (THF, 30 ml) was added dropwise into a cold solution (ice/water bath) of diethylamine (17.34 grams, 0.24 mole) and water (30 ml). The mixture was stirred at room temperature for 1 hour and then diluted with ether (100 ml). The organic phase was separated, the water phase extracted with ether (2×100 ml) and the organic solutions were combined. This combined organic solution washed with brine (150 ml) and dried over anhydrous magnesium sulfate. The solvent was then removed in a rotary evaporator and the product, 5-[2-(1',1',1'-trifluoro-2'-trifluoromethyl-2'-acetoxy)] norbornyltrichlorosilane, was dried under vacuum (24.2 grams).

C. Synthesis of Poly[5-{2-(1',1',1'-Trifluoro-2'-Trifluoromethyl-2'-Acetoxy)} Norbornylsilsesquioxane]:

The product from step 3.B was dissolved in toluene (25 grams) and placed in a round bottom flask equipped with a Dean-Stark water separator (to remove the water produced during condensation reaction) and a water condenser. To this solution, potassium hydroxide (50 mg) was added and the mixture was heated for 18 hours. Afterwards, the solutions was filtered through a frit funnel and the solvent was removed in a rotary evaporator. The remaining polymer was dried under vacuum (22.4 grams).

D. Synthesis of Poly[5-{2-(1',1',1'-Trifluoro-2'-Trifluoromethyl-2'-Hydroxy)} Norbornylsilsesquioxane]:

The polymer product from step 3.C was mixed with methanol (75 ml) and ammonium hydroxide (30% solution in water, 15 ml) and the resulting solution heated to mild reflux for 9 hours. The solution was cooled to room temperature and added dropwise into a mixture of water (1.5 liter) and concentrated hydrochloric acid (30 ml). The precipitated polymer (coagulated) was separated by decantation, rinsed with water (2×100 ml) and dried in a vacuum oven at 80° C. for two hours. This dried precipitate was then powdered, transferred into a frit funnel and washed with water (3×100 ml) and dried in a vacuum oven at 80 C for 24 hours. Yield: 17.4 grams, Mw=3,300.

EXAMPLE 4

Poly[2-Hydroxy-3,3,3-Trifluoropropylsilsesquioxane-co-5-(2-T-Butoxycarbony) Norbornylsilsesquioxane](80:20)

A. Synthesis of 5-(2-T-Butoxycarbonyl)Norbonyltrichlorosilane:

Anhydrous hexane (50 ml), t-butyl-5-norbornene-2-carboxylate (9.7 grams, 0.05 mole), and platinum on alumina (5 wt %, 300 mg) were placed in a round bottom flask equipped with a water condenser and nitrogen inlet. Trichlorosilane (13.54 grams, 0.10 mole) was added to this mixture and heated to reflux for 40 hours. Afterwards, the solution was filtered under nitrogen into a flask containing 100 mg of calcium hydride. Solvent and excess trichlorosilane were removed under vacuum. The percentage conversion was estimated by proton NMR and the product was used without further purification.

B. Hydrolysis of the Monomer Mixtures:

2-Acetoxy-3,3,3-trifluoropropyltrichlorosilane and 5-(2-t-butoxycarbonyl)norbonyltrichlorosilane were mixed together in the mole ratio of 80:20 and hydrolyzed as described in 3.B above.

C. Synthesis OF [2-Acetoxy-3,3,3-Trifluoropropylsilsesquioxane-co-5-(2-T-Butoxycarbony) Norbornylsilsesquioxane] (80:20):

The product from step 4.B was condensed to give the desired polymer as described step 3.C.

D. Synthesis OF [2-Hydroxy-3,3,3-Trifluoropropylsilsesquioxane-Co-5-(2-T-Butoxycarbony) Norbornylsilsesquioxane](80:20):

The product from step 4.C was reacted with ammonium hydroxide as described In step 3.D. The polymer was precipitated into water/acetic acid mixture.

EXAMPLE 5

Partial Protection of Poly(2-Hydroxy-3,3,3-Trifluoropropylsilsesquioxane) with an Acid-Cleavable Trimethylsilyl Group Poly(2-Hydroxy-3,3,3-trifluoropropylsilsesquioxane) (1.4 above, 4 grams, 0.024 moles of monomer units) was dissolved in anhydrous tetrahydrofuran (10 ml) and 1,1,1,3,3,3-hexamethyldisilazane (1.94 grams, 0.012 mole) was added to this mixture. The contents were heated to reflux under nitrogen for 2 hours. The partially protected polymer was precipitated into 500 ml deionized water. The precipitate was filtered through a frit funnel and dried under vacuum at 80° C. for 24 hours. Yield: 2.3 grams. Protection level: 50% by NMR.

EXAMPLE 6

Synthesis of the Di-T-Butyl Glycolate Acid-Labile Dissolution Inhibitor, Hexafluorobisphenol A mixture of hexafluorobisphenol A (20 grams, 0.06 mole), t-butyl bromoacetate (25.6 grams, 0.13 mole), potassium carbonate (19.3 grams, 0.13 mole), and potassium iodide (200 mg) in acetone (200 ml) was stirred at room temperature under nitrogen for 24 hours. Afterwards, the solids were filtered off and the solvent was removed in a rotary evaporator. The residue was dissolved in ether (200 ml) and washed with 2×200 ml deionized water and dried over anhydrous magnesium sulfate. The solvent was removed under vacuum and the residue was recrystallized form hexane (60 ml) to give 24 grams of white crystalline product. M.Pt: 58-59° C.

EXAMPLE 7

157 nm Positive Bilayer Resist

Poly(2-Hydroxy-3,3,3-trifluoropropylsilsesquioxane-co-5-(2-trimethylsilylethoxycarbonyl) norbornylsilsesquioxane)(90:10) (2.0 grams) and di(t-butyl)phenyliodonium perfluorooctane sulfonate (PFOS, 100 mg) were dissolved in propylene glycol monomethyl ether acetate (PGMEA, 16 grams) and filtered through a 0.20 microns syringe filter. Around 500-1000 ppm of a fluorinated surfactant (FC-430/3M) was added to improve the film quality.

EXAMPLE 8

Positive Bilayer Resist Formulation with an Acid-Labile Dissolution Inhibitor

Poly(2-Hydroxy-3,3,3-trifluoropropylsilsesquioxane) (1.0 gram) hexafluorobisphenol, a di-t-butyl glycolate (Example 4, 200 mg), and di(t-butyl)phenyl iodonium perfluorooctane sulfonate (PFOS, 50 mg) were dissolved in propylene glycol monomethyl ether acetate (PGMEA, 8.5 grams) and filtered through a 0.20 microns syringe filter. Around 500-1000 ppm of a fluorinated surfactant (FC-430/3M) was added to improve the film quality.

EXAMPLE 9

Positive Bilayer Resist Formulation with a Polymeric Dissolution Inhibitor

Poly(2-Hydroxy-3,3,3-trifluoropropylsilsesquioxane) (2.55 grams), Poly(t-butylmethacrylate) (MW=13,000) (0.45 g), and di(t-butyl)phenyl iodonium perfluorooctane sulfonate (PFOS, 150 mg) were dissolved in propylene glycol monomethyl ether acetate (PGMEA, 27 grams) and filtered through a 0.20 microns syringe filter. Around 500-1000 ppm of a fluorinated surfactant (FC-430/3M) was added to improve the film quality.

EXAMPLE 10

157 nm Positive Bilayer Resist Evaluation

A silicon substrate was coated with 0.6 microns of an organic underlayer and baked at 2251° C. for 2 minutes. The underlayer was overcoated with 1500 Å of a 157 nm positive bilayer composition (Examples 5 and 6). The films were baked at 1300° C. for 1 minute to drive the solvent out. The films were then imagewise exposed at 157 nm or 193 nm (dose 15-100 mJ/cm²). The film was then baked at 1300° C. for 1 minute and the top layer was developed with 0.263 N tetramethyl ammonium hydroxide. High resolution images were obtained with this resist.

EXAMPLE 11

157 nm Negative Bilayer Resist

Poly(2-Hydroxy-3,3,3-trifluoropropylsilsesquioxane) (1.0 gram), POWDERLINK® (American Cyanamid Company, 80 mg), and di(t-butyl)phenyl iodonium perfluorobutane sulfonate (PFBUS, 40 mg) were dissolved in propylene glycol monomethyl ether acetate (PGMEA, 8 grams) and filtered through a 0.20 microns syringe filter. Around 500-1000 ppm of a fluorinated surfactant (FC-430/3M) was added to improve the film quality.

EXAMPLE 12

157 nm Negative Bilayer Resist Evaluation

A silicon substrate was coated with 0.6 microns of an organic underlayer and baked at 2250° C. for 2 minutes. The underlayer was overcoated with 1500 Å of a 157 nm negative bilayer composition (Example 7). The films were baked at 1300° C. for 1 minute to drive the solvent out. The films were then imagewise exposed at 157 nm or 193 nm (dose 15-100 mJ/cm2). The film was then baked at 1300° C. for 1 minute and the top layer was developed with 0.263 N tetramethyl ammonium hydroxide. High resolution negative images were obtained with this resist.

Although this invention has been described with respect to specific embodiments, the details thereof are not to be construed as limitations, for it will be apparent that various embodiments, changes and modifications may be resorted to without departing from the spirit and scope thereof, and it is understood that such equivalent embodiments are intended to be included within the scope of this invention.

What is claimed is:

1. A process for generating a resist image on a substrate, comprising the steps of:
   (a) coating a substrate with a film of a lithographic photoresist composition comprising a radiation-sensitive acid generator and a fluorinated silsesquioxane polymer comprised of monomer units having the structure (I)

$$\left[\begin{array}{c} \begin{array}{cc} R^1 & R^2 \\ | & | \\ -Si-O-Si-O- \\ | & | \\ O & O \\ | & | \\ -Si-O-Si-O- \\ | & | \\ R^4 & R^3 \end{array} \end{array}\right] \quad (I)$$

wherein:
   $R^1$, $R^2$, $R^3$ and $R^4$ are independently selected from the group consisting of substituents having the structure of formula $-(Q)_n-CR^7R^8R^9$;
   n is zero or 1;
   Q is selected from the group consisting of arylene, substituted arylene, and $C_1$-$C_4$ alkylene optionally substituted with at least one nonhydrogen substituent selected from linear or branched alkyl and fluoroalkyl;
   $R^7$ is hydrogen, linear or branched alkyl, or fluoroalkyl;
   $R^8$ is linear or branched fluoroalkyl; and
   $R^9$ is OH, COOH or an acid-cleavable moiety;
   (b) exposing the film selectively to a predetermined pattern of deep ultraviolet radiation so as to form a latent, patterned image in the film; and
   (c) developing the latent image with a developer.

2. The process of claim 1, wherein the deep ultraviolet radiation has a wavelength of less than 250 nm.

3. The process of claim 2, wherein the deep ultraviolet radiation has a wavelength of 157 nm.

4. The process of claim 1, wherein the substrate is a bilayer substrate comprising a base layer covered by an underlayer and the photoresist composition covers the underlayer.

5. The process of claim 1, wherein $R^9$ has the formula $-(L)_v-(CO)-OR^{14}$ wherein v is zero, L is a linking group, and $R^{14}$ is 2-trialkylsilylethyl.

6. The process of claim 5, wherein the fluorinated silsesquioxane polymer further comprises additional monomer units having the structure of formula (IV)

$$\left[\begin{array}{c} \begin{array}{cc} R^{10} & R^{11} \\ | & | \\ -Si-O-Si-O- \\ | & | \\ O & O \\ | & | \\ -Si-O-Si-O- \\ | & | \\ R^{13} & R^{12} \end{array} \end{array}\right] \quad (IV)$$

wherein $R^{10}$, $R^{11}$, $R^{12}$ and $R^{13}$ are independently hydrogen, linear or branched alkyl, or an acid-cleavable moiety, with the proviso that at least one of $R^{10}$, $R^{11}$, $R^{12}$ and $R^{13}$ is an acid-cleavable moiety.

7. The process of claim 5, wherein the deep ultraviolet radiation has a wavelength of less than 250 nm.

8. The process of claim 7, wherein the deep ultraviolet radiation has a wavelength of 157 nm.

9. The process of claim 5, wherein the substrate is a bilayer substrate comprising a base layer covered by an underlayer and the photoresist composition covers the underlayer.

10. The process of claim 1, wherein $R^1$, $R^2$, $R^3$ and $R^4$ are independently selected from $$-C\begin{pmatrix} CF_3 \\ OH \end{pmatrix}, \quad -\underset{H}{C}\begin{pmatrix} CF_3 \\ OH \end{pmatrix}, \quad -C\begin{pmatrix} CF_3 \\ OH \end{pmatrix},$$

$$-C\begin{pmatrix} CF_3 \\ OH \\ CF_3 \end{pmatrix}, \quad -\underset{H}{C}\begin{pmatrix} CF_3 \\ OH \\ CF_3 \end{pmatrix}, \quad -\underset{H}{C}\begin{pmatrix} CF_3 \\ OH \\ CF_3 \end{pmatrix}$$

-continued
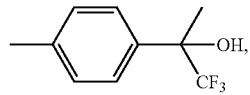 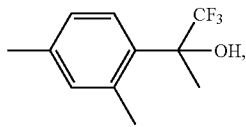 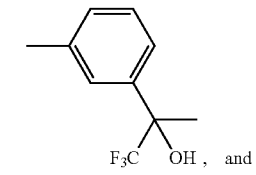 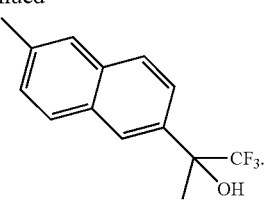
and
* * * * *